US008142204B2

(12) United States Patent
Giesbrecht et al.

(10) Patent No.: US 8,142,204 B2
(45) Date of Patent: Mar. 27, 2012

(54) AUTOMATION APPLIANCE WHICH USES THE SAME CONFIGURATION PLUG CONNECTORS FOR CONNECTING ANTENNA PLUG AND COAXIAL CABLE

(75) Inventors: Andreas Giesbrecht, Loehne (DE); Bernd Eickhoff, Melle (DE); Sven Battermann, Minden (DE)

(73) Assignee: WAGO Verwaltungsgesellschaft mbH, Minden (DE)

( * ) Notice: Subject to any disclaimer, the term of this patent is extended or adjusted under 35 U.S.C. 154(b) by 0 days.

(21) Appl. No.: 12/825,784

(22) Filed: Jun. 29, 2010

(65) Prior Publication Data

US 2010/0328910 A1    Dec. 30, 2010

(30) Foreign Application Priority Data

Jun. 30, 2009   (DE) .................... 20 2009 009 066 U

(51) Int. Cl.
*H01R 12/00* (2006.01)
(52) U.S. Cl. ...................................... 439/76.1
(58) Field of Classification Search ............... 439/76.1, 439/579, 916; 343/70, 702, 725; 174/52.1, 174/52.2
See application file for complete search history.

(56) References Cited

U.S. PATENT DOCUMENTS

| | | | |
|---|---|---|---|
| 5,443,390 A * | 8/1995 | Kokkosoulis et al. | 439/76.1 |
| 6,394,817 B1 * | 5/2002 | Kihira et al. | 439/76.1 |
| 6,447,303 B1 * | 9/2002 | Kihira et al. | 439/63 |
| 6,634,910 B2 * | 10/2003 | Lieb et al. | 439/715 |
| 6,701,189 B2 * | 3/2004 | Fang et al. | 607/48 |
| 6,783,373 B2 * | 8/2004 | Hsu et al. | 439/76.1 |
| 6,881,101 B2 * | 4/2005 | Sichner et al. | 439/717 |
| 7,077,692 B2 * | 7/2006 | Chintala | 439/500 |
| 7,262,735 B2 * | 8/2007 | Noe | 343/702 |
| 7,383,992 B2 * | 6/2008 | Le | 235/441 |
| 7,492,319 B2 * | 2/2009 | Lindackers et al. | 343/713 |
| 7,878,830 B2 * | 2/2011 | Duesterhoeft et al. | 439/248 |
| 2003/0124883 A1 * | 7/2003 | Hsu et al. | 439/76.1 |
| 2006/0079105 A1 * | 4/2006 | Chintala | 439/76.1 |
| 2010/0248503 A1 * | 9/2010 | Kang et al. | 439/63 |

FOREIGN PATENT DOCUMENTS

| | | |
|---|---|---|
| DE | 10 2007 003 196 | 7/2007 |
| WO | WO 96/12993 | 5/1996 |

\* cited by examiner

*Primary Examiner* — Tulsidas C Patel
*Assistant Examiner* — Vladimir Imas
(74) *Attorney, Agent, or Firm* — Whitham Curtis Christofferson & Cook, PC

(57) ABSTRACT

An automation appliance with at least one wireless communication interface has electronics arranged on a printed circuit board, where the printed circuit board is in a housing having externally accessible plug connectors. A plug connector is connected to the communication interface electronics and is aligned adjacent to the printed circuit board in the area of the interface electronics. The plug connector has a center contact for RF signal connection surrounded by outer contacts that provide RF shielding. Another plug connector of similar mechanical design is also provided which provides for cable based communications interface and is not a RF plug.

12 Claims, 2 Drawing Sheets

AUTOMATION APPLIANCE WHICH USES THE SAME CONFIGURATION PLUG CONNECTORS FOR CONNECTING ANTENNA PLUG AND COAXIAL CABLE

Field of the Invention

The invention relates to an automation appliance having at least one wireless communication interface for data communication with further automation appliances and/or field devices, and having control electronics, wherein the control electronics and communication interface electronics for the at least one communication interface are arranged on a printed circuit board which is introduced into a housing, and in which housing externally accessible plug connectors are provided, in order to provide communication interfaces, and are connected to the communication interface electronics and/or to the control electronics.

Automation appliances for controlling and monitoring field devices, which communicate via a field bus, have been known for a long time, in particular from industrial and building automation.

By way of example, WO 96/12993 A1 describes an apparatus for accessing field devices in a distributed control system with redundant wireless access to field devices.

DE 10 2007 003 196 A1 discloses a communication system for data interchange in an automation installation for communication between central and peripheral devices.

A converter for cable-based communication with the central device and for wireless communication with the peripheral devices is connected in the communication path between the central and peripheral devices. A converter such as this may, for example, be a field bus coupler or a repeater.

Automation appliances such as these which have a wireless communication interface are conventionally equipped either with an antenna which is integrated in the housing of the automation appliance, or with an antenna which can be plugged on. In the case of the antenna which can be plugged on, a special antenna plug is conventionally installed in the housing.

This requires an additional structure and a specific design of automation appliances which communicate wirelessly, in comparison to purely cable-based automation appliances.

When designing the automation appliances which communicate wirelessly, the automation appliance and the antenna must be matched to one another so as to ensure that the antenna has a desired and required polar diagram.

BACKGROUND

Summary

The object of the present invention is therefore to provide an improved automation appliance.

The object is achieved with the automation appliance of the type mentioned initially in that at least one plug connector, which is connected to communication interface electronics for a wireless communication interface, is aligned adjacent to the printed circuit board in the area of the communication interface electronics and has a centrally arranged center contact for an RF antenna signal connection and a plurality of outer contacts, which surround the central center contact, for, an RF shielding potential, and in that the at least one plug connector for a respective wireless communication interface is intended to hold an antenna plug and has the same mechanical design as a plug connector which is used for a corresponding cable-based communication interface in corresponding automation appliances, and which is not a radio-frequency antenna plug.

Since specialized antenna plugs are not used for the antenna connection, but rather the same plug connectors which are also used for the cable-based communication interface, with a center contact and outer contacts surrounding this, the housing and associated plug design of purely cable-based automation appliances and combined cable-based and wireless automation appliances can remain the same. This reduces the effort for design, manufacture and assembly as well as storage. It has been found that the standard plug connectors having a center contact and outer contacts surrounding it are also suitable for RF transmission and have adequate electromagnetic characteristics for automation appliances, allowing RF antenna signals to be output.

Standard plug connectors such as these can be used for cable-based communication in particular because the at least one plug connector, which is intended to provide a wireless communication interface, is arranged adjacent to the communication interface electronics which are provided for the respective wireless communication interface. This results in the communication interface electronics of the wireless communication interface providing an opposing pole for the antenna plug, that is to say the plug connector which is provided with an antenna plug. Therefore, together with the adjacent part of the printed circuit board and the housing, and in addition to the antenna plug and the antenna or coaxial line arranged thereon, the communication interface electronics form a part of the effective antenna for the wireless communication interface.

In this context, it is particularly advantageous for the plug connector which is intended for the wireless communication interface to be aligned at right angles to the printed circuit board. The axes of the center contact and of the outer contacts which surround the center contact are therefore approximately at right angles to the printed circuit board of the automation appliance, which printed circuit board has the electronics and conductor tracks on it.

It is particularly advantageous if the outer contacts of the at least one plug connector for a respective wireless communication interface are electrically conductively connected to a ground plane on the printed circuit board, which ground plane is arranged adjacent to communication interface electronics which are adjacent to the respective plug connector. This allows the foot-point impedance of the antenna monopole to be defined largely independently of the housing through the ground plane, since the plug connector operates with the antenna connected thereto with respect to a fixed ground base.

The central center contact and the outer contacts of the plug connectors are preferably embedded in insulating material, wherein the insulating material is surrounded by a lock (for example a screw thread, bayonet, locking thread, etc.) which is electrically conductively connected to the ground potential of the housing. The RF shielding potential is then preferably decoupled from the ground potential of the housing, with respect to the real power. Because of this, the foot-point impedance is not dependent on the ground potential of the housing and the lock, and further electrically conductive parts connected thereto, but depends exclusively on the RF shielding potential of the outer contacts. This RF shielding potential can be provided by forming a dedicated ground plane on the printed circuit board as a floating ground with respect to the ground which is applied to the housing and the screw thread connection. The RF shielding potential and the ground potential are not directly electrically conductively connected to one another, but only capacitively coupled to one another by the surrounding air or a dielectric.

This embodiment has the advantage that the screw thread connection is not used as an RF shield but is only connected to the housing ground. Interference is therefore not passed via the RF shield to the printed circuit board, but is trapped in advance by the housing and the screw thread connection which is not electrically connected directly to the printed circuit board.

M12 round plug connectors are preferably used as plug connectors and are already used as standard for automation appliances. These M12 round plug connectors or other standard plug connectors can be designed for ingress protection class IP67, in contrast to conventional special antenna plug connectors. This allows the housing interior and the printed circuit board arranged therein, together with its electronic components, to be protected against moisture and other environmental influences.

The automation appliances are preferably field bus couplers, offset local communication subscribers (for example, I/O modules) which are linked wirelessly or repeaters.

In conjunction with such automation appliances, an antenna plug which is intended for connection to a plug connector of an automation appliance such as this has a central connecting pole, which is electrically conductively connected to an antenna conductor, and off-center connecting poles which surround the central connecting pole. An antenna conductor which is connected to the center contact is then sheathed by an insulating material which is connected to the antenna plug. This allows a monopole antenna to be integrated easily and at low cost in a mating plug connector for the standard plug connector, for example an M12 round plug connector.

However, it is also advantageous to use an antenna plug adapter for connection to a plug connector of an automation appliance as described above, which has a mating plug connector, which corresponds to a plug connector of the automation appliance for a wireless communication interface, with a central connecting pole and surrounding off-center connecting poles as well as a coaxial antenna plug connector. The coaxial antenna plug connector has a central RF signal center contact and a shielding wall which surrounds the RF signal center contact. The RF signal center contact is then electrically conductively connected to the central connecting pole of the mating plug connector, and the shielding wall is electrically conductively connected to the off-center connecting poles of the mating plug connector. This antenna plug adapter makes it possible to provide an adapter in a cost-effective manner, which allows connection of an antenna which has a conventional antenna plug to a standard plug connector, for example an M12 round plug connector.

DESCRIPTION OF THE DRAWINGS

The invention will be explained in more detail in the following text using an exemplary embodiment and with reference to the attached drawings, in which.

DETAILED DESCRIPTION

Figure 1:
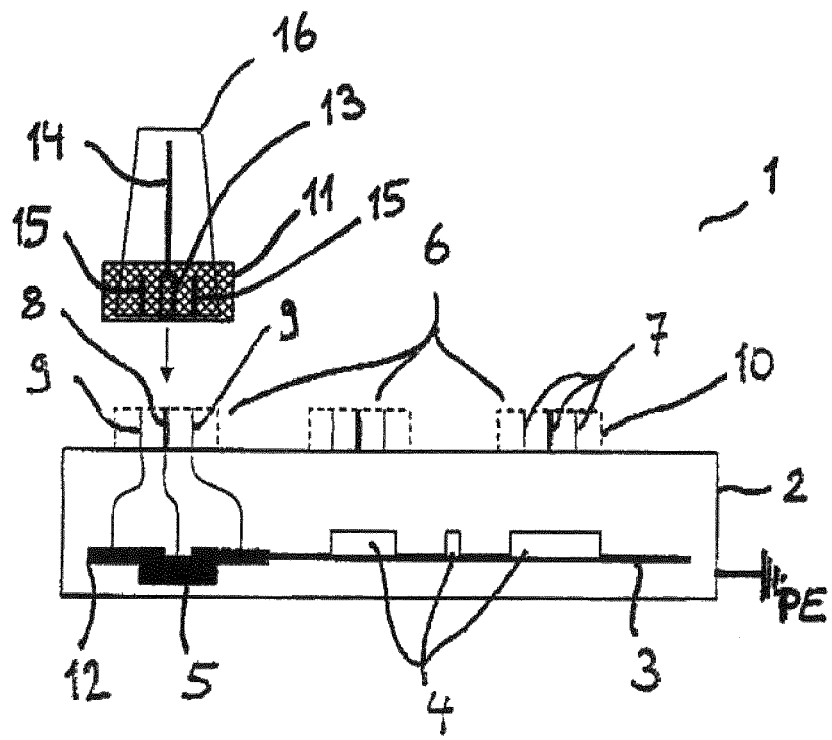
FIG. 1 shows a sketch of an automation appliance with an antenna plug, in the form of a section view.

FIG. 1 shows an automation appliance 1 in the form of a cross-sectional side view. The automation appliance 1 has a housing 2 in which a printed circuit board 3 has been introduced in a manner known per se. The printed circuit board 3 is fitted with control electronics 4 which are electrically conductively connected to one another via conductor tracks on the printed circuit board 3. The printed circuit board 3 is furthermore fitted, for example, on its lower face, with communication interface electronics 5, which contain control logic for a wireless communication interface, as well as a transmitter and/or receiver (transceiver). The communication interface electronics 5 can be used to interchange data via an antenna which is connected to the communication interface electronics 5 with field devices, automation appliances or repeaters, which are located within radio range.

A plurality of plug connectors 6 are arranged in a manner known per se on the upper face of the housing 2 and, for example, are in the form of M12 round plug connectors. The plug connectors 6 have connecting contacts 7 which are electrically conductively connected to the control electronics 4 and/or to the communication interface electronics 5, and possibly to a ground potential.

The connecting contacts 7 essentially consist of a centrally arranged center contact 8 as well as outer contacts 9 which surround this center contact 8 and are arranged on a circumference. The outer contacts 9 and the center contact 8 are introduced into insulating material. A thread 10 is provided on the outer circumference of the plug connectors 6, in order to fix a matching mating plug connector, which is plugged onto the plug connector 6, on the thread 10 with the aid of a union nut 11. A ground plane 12 is applied to the printed circuit board 3 adjacent to the communication interface electronics 5, and is isolated from the housing ground PE, which is connected to the appliance housing 2, for example, and represents a "floating" ground with respect to the housing ground PE.

One of the plug connectors 6 is provided above this ground plane 12 and above the communication interface electronics 5, in order to hold an antenna or an antenna coaxial cable. For this purpose, the center contact 8 is electrically conductively connected to the antenna input/output of the communication interface electronics 5, while the outer contacts 9 are electrically conductively connected to the ground plane 12 of the "floating" ground.

In this way, the standard M12 round plug connector 6 forms an antenna connection for the automation appliance 1.

An antenna plug which can be fitted to this plug connector 6 has a central connecting pole 13, which corresponds to the center contact 8, and to which a monopole antenna 14 or, if required, an antenna coaxial line or a coaxial antenna socket is connected. The off-center connecting poles 15 which correspond to the outer contacts 9 are not electrically conductively connected any further in the case of the antenna plug that is illustrated by way of example.

The antenna conductor of the monopole antenna 14 is housed in an insulating material 16, which forms an antenna head.

Figure 2:
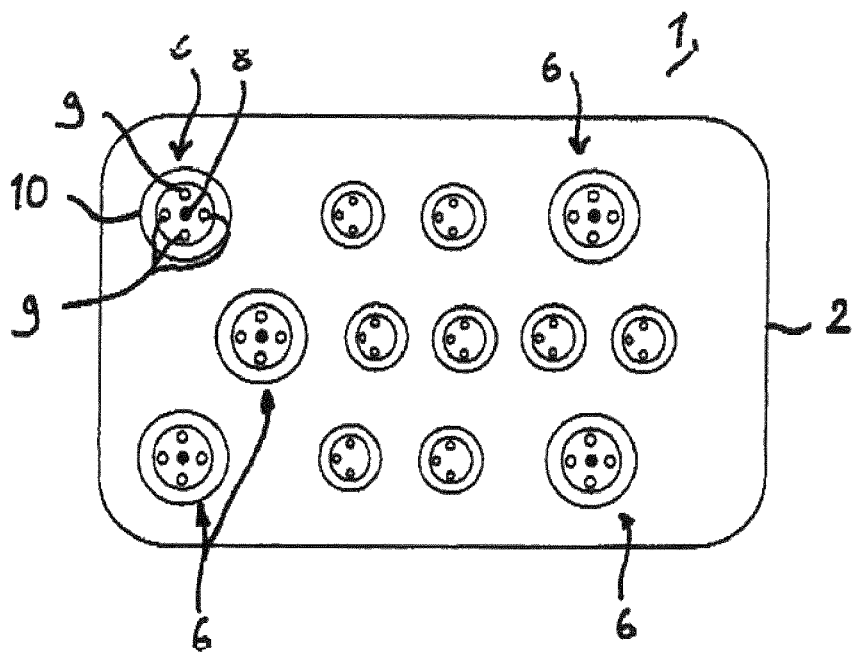
FIG. 2 shows a plan view of the automation appliance shown in FIG. 1.

FIG. 2 shows a sketch of an example of an automation appliance 1, in which plug connectors 6 are provided, partially in the form of M12 round plug connectors, with a center contact 8 and outer contacts 9. In addition to these plug connectors 6, further plug connectors of a different type can be provided for different purposes.

Figure 3:
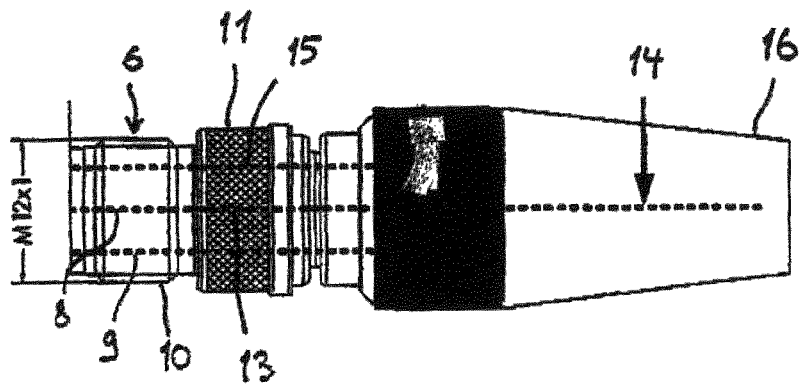
FIG. 3 shows a sketch of an antenna plug in the form of a side view.

FIG. 3 shows a side view of an antenna plug which is plugged onto a plug connector 6. As can clearly be seen, the central connecting pole 13 of the antenna plug is electrically conductively connected to the center contact 8, and the off-center connecting poles 15 are electrically conductively connected to the outer contacts 9. The central connecting pole 13 is connected to a monopole antenna 14, which is housed in insulating material 16 as an encapsulating compound.

Figure 4:
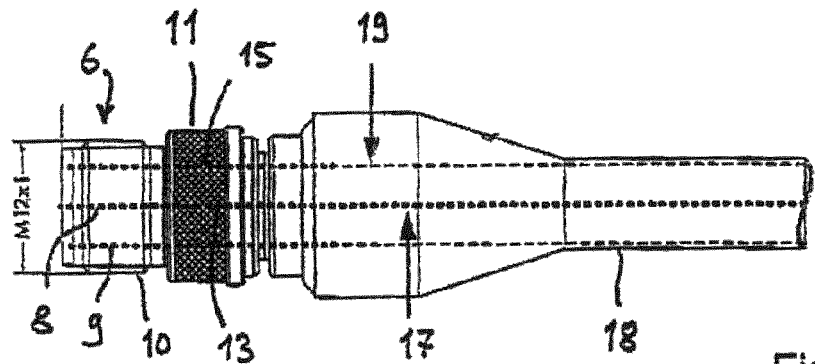
FIG. 4 shows a sketch of an antenna plug with an antenna coaxial line.

FIG. 4 shows another embodiment of an antenna plug, in which the central connecting pole 13 is connected to the central inner conductor 17 of a coaxial line 18, while the off-center connecting poles 15 are connected to a shielding sheath 19 on the coaxial line 18.

Figure 5:
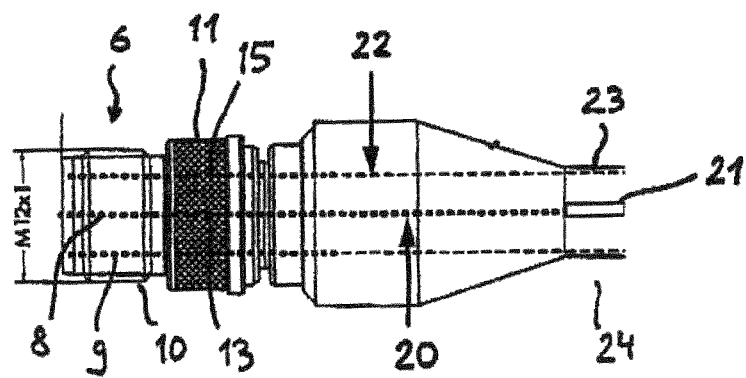
FIG. 5 shows a sketch of an antenna plug with a coaxial antenna socket for connection of a standard antenna.

FIG. 5 shows another embodiment of an antenna plug, in which the central connecting pole 13 is connected via a central conductor 20 to a central connecting socket 21 of a coaxial antenna socket. The off-center connecting poles 15 which are connected to the outer contacts 9 in the mated state as illustrated are themselves connected via conductors 22 or a shielding sheath to a shielding sheath 23 which surrounds the central connecting contact 21 for the coaxial antenna socket 24. By way of example, the coaxial antenna socket may be an SMA or TNC antenna plug connector. This allows a standard antenna to be used with a standard antenna plug such as this, which corresponds to the coaxial antenna socket 24, in conjunction with a standard automation appliance 1, which has standard plug connectors which are not in the form of special antenna plug connectors. In this way, the antenna plug forms an adapter coupling piece.

The invention claimed is:

1. Automation appliance having at least one wireless communication interface for data communication with further automation appliances and/or field devices, and having control electronics and communication interface electronics, wherein the control electronics and communication interface electronics are arranged on a printed circuit board in a housing which includes externally accessible plug connectors that are connected to the communication interface electronics and/or to the control electronics wherein at least one plug connector of said plug connectors is connected to the communication interface electronics for a wireless communication interface, is aligned adjacent to the printed circuit board, and has a centrally arranged center contact for an RF antenna signal connection and a plurality of outer contacts which surround the center contact for an RF shielding potential, and wherein the at least one plug connector is configured hold a plug and has the same mechanical configuration as a plug connector used for a cable-based communication interface in corresponding automation appliances.

2. The automation appliance according to claim 1, wherein the at least the plug connector is aligned at approximately a right angle to the printed circuit board such that axes of the center contact and of the outer contacts are at right angles to a plane which is covered by the printed circuit board.

3. The automation appliance according to claim 1, wherein the outer contacts of the at least one plug connector are electrically conductively connected to a ground plane on the printed circuit board, which ground plane is arranged adjacent to the communication interface electronics.

4. The automation appliance according to claim 1, wherein the center contact and the outer contacts of the at least one plug connector are embedded in insulating material, and the insulating material is surrounded by a lock wherein the lock is electrically conductively connected to a ground potential of the housing, and an RF shielding potential is decoupled from the ground potential of the housing.

5. The automation appliance according to claim 1, wherein the plug connectors are M12 round plug connectors.

6. The automation appliance according to claim 5, wherein the M12 round plug connectors are configured for ingress protection class IP-67.

7. The automation appliance according to claim 1, wherein the automation appliance is a field bus coupler.

8. The automation appliance according to claim 1, wherein the automation appliance is a repeater.

9. Plug for connection to a plug connector of an automation appliance having at least one wireless communication interface for data communication with further automation appliances and/or field devices, and having control electronics and communication interface electronics, wherein the control electronics and communication interface electronics are arranged on a printed circuit board in a housing which includes externally accessible plug connectors that are connected to the communication interface electronics and/or to the control electronics wherein at least one plug connector of said plug connectors is connected to the communication interface electronics for a wireless communication interface, is aligned adjacent to the printed circuit board, and has a centrally arranged center contact for an RF antenna signal connection and a plurality of outer contacts which surround the center contact for an RF shielding potential, and wherein the at least one plug connector is configured hold a plug and has the same mechanical design as a plug connector used for a cable-based communication interface in corresponding automation appliances wherein the plug has a central connecting pole which is electrically conductively connected to a conductor, and off-center connecting poles which surround the central connecting pole.

10. The plug of claim 9 wherein said conductor is an antenna, and wherein said conductor is sheathed by an insulating material.

11. The plug of claim 9 wherein said conductor is connected to a coaxial line.

12. the plug of claim 9 wherein said off-center connecting poles are connected to a shielding sheath of a coaxial cable.

* * * * *